United States Patent [19]

Nelson

[11] Patent Number: 4,764,104
[45] Date of Patent: Aug. 16, 1988

[54] NARROW BAND THERMAL EMITTER

[75] Inventor: Robert E. Nelson, Weston, Mass.

[73] Assignee: TPV Energy Systems, Inc., Waltham, Mass.

[21] Appl. No.: 815,888

[22] Filed: Jan. 3, 1986

Related U.S. Application Data

[60] Division of Ser. No. 634,379, Jul. 31, 1984, Pat. No. 4,584,426, which is a continuation-in-part of Ser. No. 529,016, Sep. 2, 1983, abandoned.

[51] Int. Cl.[4] ............................................. F21H 1/02
[52] U.S. Cl. ................................... 431/100; 252/492; 427/159
[58] Field of Search ................ 431/100; 136/246, 253; 252/492; 427/159

[56] References Cited

U.S. PATENT DOCUMENTS

| | | |
|---|---|---|
| 3,331,707 | 7/1967 | Werth . |
| 3,751,303 | 8/1973 | Kittl . |
| 3,929,510 | 12/1975 | Kittl . |
| 4,234,352 | 11/1980 | Swanson . |
| 4,313,024 | 1/1982 | Horne . |
| 4,584,426 | 4/1986 | Nelson ............................. 136/253 |

OTHER PUBLICATIONS

Ives et al., "A Physical Study of the Welsbach Mantle", Journal of The Franklin Institute, vol. 186, No. 1114–33, pp. 401–625 (1918).
White et al., "P-I-N" Structures for Controlled Spectrum Photovoltaic Converters" Advisory Group for Aerospace Research and Development North Atlantic Treaty Organization, pp. 897–922 (1967).
White, "Diffuse-Reflectance Spectra of Rare-Earth Oxides", Applied Spectroscopy, vol. 21, No. 3, pp. 167–171 (1967).
Durand, "Performance Characteristics of High Temperature Gas-Fired Mantle Systems", Technical Report AFATL-TR-69-115, pp. 1–39, (1969).
Kittl et al., "Design Analysis of TPV-Generator System", Proc., 25th Annual Power Sources Conf., (1972).
Guazzoni, "High-Temperature Spectral Emittance of Oxides of Erbium, Samarium, Neodymium and Ytterbium", Applied Spectroscopy, vol. 26, No. 1, pp. 60–65 (1972).
Guazzoni et al., "Cylindrical Erbium Oxides Radiator Structures for Thermophotovoltaic Generators", R & D Technical Report ECOM-4249, pp. 1–27 (1974).

Primary Examiner—Randall L. Green

[57] ABSTRACT

A high output, narrow band thermally energized radiation source comprises a rare earth oxide radiator member that has a cross-sectional dimension in the range of five to thirty micrometers, the rare earth oxide radiator member, when heated to about 1700° C., having a concentrated radiated flux over the 400–2500 nanometer wavelength range such that at least 50% of the radiated flux is within a spectral band that is less than 400 nanometers wide.

13 Claims, 2 Drawing Sheets

NARROW BAND THERMAL EMITTER

This application is a division of prior pending Ser. No. 634,379 filed July 31, 1984, now U.S. Pat. No. 4,584,426, which is a continuation-in-part of application Ser. No. 529,016 filed Sept. 2, 1983, now abandoned.

This invention relates to radiation sources and more particularly to sources of the thermally excited type in which radiation is emitted from a heated element, and to thermophotovoltaic devices.

Radiation sources of the thermally excited type such as incandescent lamps in which light is emitted from a highly heated resistance wire and incandescent mantles of the Welsbach type have long been known. Such radiation sources generally have characteristics of the "black body", or more realistically "gray body", type and emit radiation over a broad spectral band. In accordance with one aspect of the invention, there is provided a thermally excited radiation source that has a narrow peak in the spectral profile of its radiated flux and skirt portions of the radiated flux profile on either side of the narrow peak are suppressed so that the emitted radiation has a concentrated spectral distribution.

Such a thermally excited narrow band radiation source may have a variety of applications and, for example, may usefully be coupled to a photovoltaic cell to provide a thermophotovoltaic device. Radiation that is absorbed by a photovoltaic cell in the neighborhood of a potential barrier, usually a pn junction, gives rise to separated electron-hole pairs which create an electric potential. The photocell conversion efficiency is a function of the band gap (in electron volts) and the temperature of the particular photocell material. Among the known types of photocell material are silicon, which has a band gap of about 1.1 electron volts, equivalent to a wavelength of about 1150 nanometers; and germanium, which has a band gap of about 0.7 electron volt, equivalent to a wavelength of about 1800 nanometers. In a thermophotovoltaic device, a close match between the spectrum of photon energy radiated from the radiation source and the electron production threshold of the photovoltaic cell results in a greater amount of energy which is absorbed by the photovoltaic cell being converted to electrical energy and a minimal amount being converted to heat. Silicon photovoltaic cells have relatively low conversion efficiency in direct sunlight, in part because the specific spectral energy of solar radiation does not provide a good spectral match with the response of a silicon photovoltaic cell as that portion of solar radiation with wavelengths longer than 1100 nanometers is useless to the silicon cell photovoltaic conversion process and generates heat in the cell requiring an increased effort for cooling to keep the cell at its best performance, and as the maximum spectral radiance in sunlight occurs at about 500 nanometers which corresponds to a photon energy of 2.5 electron volts, while only 1.1 electron volts are required to produce the hole-electron pairs in silicon which contribute to external current flow and power output. The surplus energy of photons in the spectral region below 1100 nanometers is also converted to heat in the cell. While Welsbach mantles have been proposed for use in thermophotovoltaic energy conversion systems, such uses are not particularly efficient as such mantles generate substantial amounts of radiation throughout a spectral region that extends from the visible well into the infrared. Other proposed thermophotovoltaic energy conversion systems have used reflector and rare earth active filter arrangements.

In accordance with one aspect of the invention, the rare earth oxide radiator member of the narrow band thermally energized radiation source has a cross-sectional dimension in the range of five to thirty micrometers, and that rare earth oxide radiator member, when heated to about 1700° C., has a concentrated radiated flux over the 400-2500 nanometer wavelength range such that at least 50% of the radiated flux is within a spectral band that is less than 400 nanometers wide. The radiation source may be thermally excited by various techniques including, for example, electrical energy or liquid or gaseous fuels such as hydrogen, natural gas, propane, butane, isobutane or gasoline.

In preferred embodiments, the narrow band thermally excited radiation source is composed of interlocked fibers of at least one oxide of a host rare earth metal selected from a class consisting of erbium, holmium, neodymium and ytterbium, the radiated flux of the radiation source having a full width at half maximum (at ½ the maximum radiated flux of the source) of less than 400 nanometers. The relative spectral irradiance profiles of preferred radiators also have suppressed skirt characteristics such that at wavelengths 500 nanometers above and below the peak wavelength, the skirts have radiated fluxes that are less than ten and more preferably less than five percent of the profile peak radiated flux. In particular embodiments, the radiation source is a self-supporting rare earth oxide fiber mantle that defines a hollow space, and that is secured on a support tube by an integral shrunken skirt portion.

In accordance with another aspect of the invention there is provided a thermophotovoltaic device that includes a photocell and a radiator of rare earth metal oxide material disposed in optically coupled relation to the photocell. Such thermophotovoltaic devices may be used in power generation, topping cycles, cogeneration, or communication applications, for example. The radiator and photocell may be close coupled, for example in the same housing, or spaced apart with the radiation from the radiator focused on the more remotely located photocell, or coupled as by means of fiber optic technology. The thermophotovoltaic device also includes means for thermally exciting the radiator to cause it to emit radiation in a spectral irradiance profile that has a radiated flux peak with a full width at half maximum of less than 400 nanometers, the radiated flux peak being less than 400 nanometers below (on the higher energy side of) the electron production threshold of the photocell. The photon conversion efficiency of preferred thermophotovoltaic devices is more than fifty percent.

In accordance with still another aspect of the invention a radiator of rare earth metal oxide material is thermally excited at a temperature in the range of 1500°-2000° C. to cause the radiator to emit radiation in a spectral irradiance profile that has a narrow radiated flux peak that has a full width at half maximum of less than 400 nanometers and preferably less than 200 nanometers, and suppressed skirt characteristics such that at wavelengths in the range of 300-500 nanometers above and below the flux peak, the radiated flux levels of the skirts are less than ten and preferably less than five percent of the peak radiated flux.

In particular thermophotovoltaic device embodiments, the thermal excitation system includes a liquid hydrocarbon fuel supply, a conduit connected to the fuel supply that has an outlet port aligned with the rare earth metal oxide radiator, a fuel control for controlling the flow of fuel through the conduit to the radiator, and an igniter mechanism for igniting the fuel. Particular radiators are self-supporting rare earth metal oxide fiber mantles that are composed of metal oxide multi-filament strands with cross-sectional strand dimensions in the range of 0.05–0.3 millimeter and filament cross-sectional dimensions in the range of five to thirty micrometers. A reflector system may advantageously be employed for collecting, directing and concentrating the radiated flux from the mantle to the photocell, and radiation transmitting thermal isolation structure may be positioned between the mantle (or mantles) of the radiation source and the photovoltaic cell array. Particularly useful thermophotovoltaic devices include an ytterbia mantle coupled to a silicon type photocell and an erbia mantle coupled to a germanium type photocell.

Mantle arrangements such as multiple mantles or mantles of more complex geometry such as pleated structures that are designed to radiate more energy without a corresponding increase in convection loss may also be employed in thermophotovoltaic devices in accordance with the invention. Additional efficiency enhancement may be obtained by a regenerator through which the hot convection gas is routed to warm the incoming combustion air.

Other features and advantages of the invention will be seen as the following description of particular embodiments of the invention progresses, in conjunction with the drawings, in which.

DESCRIPTION OF PARTICULAR EMBODIMENTS

Figure 1:
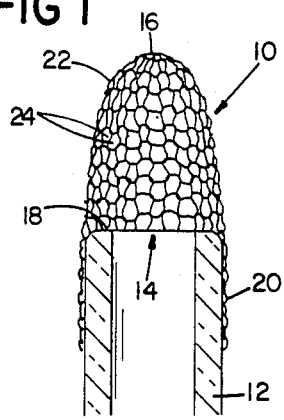
FIG. 1 is an enlarged view of a mantle type radiation source and its support in accordance with aspects of the invention.
Figure 2:
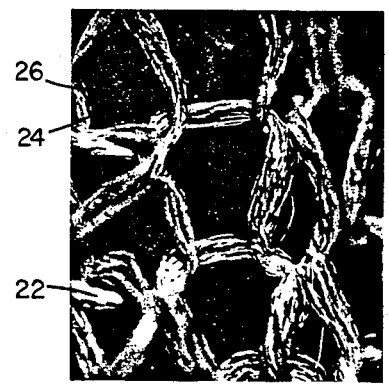
FIG. 2 is a magnified view of a portion of the rare earth oxide fabric of the mantle shown in FIG. 1.

The diagrammatic view of FIG. 1 shows a radiation source 10 of the mantle type that is mounted on support tube 12 of mullite or other suitable heat resistant material. Support tube 12 has an outer diameter of about five millimeters and an inner diameter of about three millimeters. Mantle 10 is a self-supporting ytterbia fiber fabric structure that defines a hollow chamber 14 of about seventy cubic millimeters volume with tip 16 about ½ centimeter above the upper end surface 18 of support tube 12. The lower portion 20 of the mantle fabric is about ½ centimeter in length and is firmly shrink-secured to the outer surface of support tube 12. The mantle fabric is formed of ytterbia multi-filament strands 22 in an open knit array with openings 24 such that the open area of the fabric is about 60%. The cross-sectional dimensions of the individual ytterbia filaments 26 (FIG. 2) of strands 22 are in the range of about five-ten micrometers, and the strands 22 have cross-sectional dimensions in the order of about 0.1 millimeter with openings 24 having dimensions of about 0.5 millimeter.

A process for manufacturing mantle 10 is as follows. Continuous low twist, low tenacity (highly reticulated), viscose rayon yarn (150 denier/60 filament) is knitted into a continuous tubular sleeve using a Lamb circular string knitter (Model ST3A/ZA) with a 2.2 centimeter diameter arbor and 24 needle capacity using 12 equally spaced needles in the arbor. The yarn is knitted into a continuous tubular sleeve with tension on both the yarn and the knitted sleeve to attain about three stitches per linear centimeter of tensioned sleeve, and the continuous length of knitted sleeve is wound onto a take-up spool.

An imbibing solution is formed by dissolving hydrated ytterbium nitrate ($Yb(NO_3)_3.4\ H_2O$) (reagent grade) in distilled water (together with a small amount of a non-ionic wetting agent such as Triton X-100) to provide a solution 1.75 molar in ytterbium nitrate.

A knitted rayon sleeve unit, about thirty centimeters long, is immersed for about ten minutes in the imbibing solution at room temperature, with gentle agitation to promote penetration of the imbibing solution into the rayon fibers. After the ten minute imbibition, the sleeve is removed from the solution, squeeze dried and then transferred to a plastic centrifuge tube The sleeve is then centrifuged for ten minutes at about 200 g's to remove surface liquid. It is convenient to secure a metal screen halfway from the bottom of the centrifuge tube so that liquid does not rewet the surface of the sleeve during or after centrifugation.

After centrifugation, the imbibed sleeve is formed into mantle socks with aid of a Teflon sock-shaping rod that is fourteen millimeters in diameter and has a hemispherical end. A seven centimeter length of imbibed sleeve is slipped over the shaping rod, and tied off at the hemispherical end of the shaping rod with a piece of treated yarn unraveled from the bottom of the knit sleeve. The shaped sock is then dried with a flow of hot (about 90° C.) air, slipped off the shaping rod, cut to about 3.6 centimeters length, and then hung on a fixture that includes a series of upstanding mullite posts (spaced at about three centimeter intervals) on a mullite base. Each post has a diameter of about three millimeters and a length of about 3.7 centimeter and receives a support tube 12 and spacer, the top of tube 12 being spaced about five millimeters below the top of the post so that the top of the shaped sock is supported on the mullite post and the lower portion of the shaped sock extends over the support tube 12. Optionally a ring of sodium silicate that has been pretreated by heating tube 12 to about 900° C. may be carried by tube 12.

The fixture with knitted imbibed socks hung over the support sleeves 12 on the fixture posts is then subjected to a firing procedure to convert the ytterbium nitrate imbibed cellulosic mantle socks into densified ytterbia mantles.

In the firing sequence, the fixture with imbibed socks is placed in a tubular oven that is about 1.2 meters in length and about five centimeters in inner diameter. At ambient temperature (about 25° C.), the oven is flushed with tank nitrogen at a flow rate of 200 cubic centimeters per minute (a flow velocity of about ten centimeters per minute), and with this inert atmosphere in the oven, the oven temperature is increased at a rate of 400° C. per hour. The mantle fabric undergoes denitration at about 160° C. At this point the fabric color changes rapidly from white to golden tan. Immediately after this color change, oxygen is added to the nitrogen flow at a rate of about five cubic centimeters per minute. Heating continues at the same rate to a temperature of about 320° C. During this time the color continuously changes from golden tan to dark brown or black with modest shrinkage (about 10%) of the fabric, which indicates partial decomposition of the organic material. The oven temperature is then held at about 320° C. for about one and one-half hours and the mantle color turns from black to light gray or white. During this soaking interval, the remaining carbon is oxidized and driven off and the mantle shrinks to about ⅓ its original dimensions with its lower portion 20 shrunk onto tube 12 essentially as shown in FIG. 1. At the end of the soaking interval, the flow of oxygen is increased to fifty cubic centimeters per minute (a gas mixture of 20% oxygen) and the oven temperature is increased over a twenty-four minute interval to a temperature of 900° C. The heater is then turned off and the oven is rapidly cooled to ambient temperature. After cooling, each mantle subassembly is removed from its storage holder post and is exposed to a burning mixture of isobutane and air (at an estimated mantle temperature of about 1700° C.) for five minutes to further shrink and densify the ytterbia fabric.

The resulting ytterbia fabric, in visual appearance, substantially retains characteristic physical textile attributes of its precursor rayon fabric, although it is substantially reduced in dimension. This ytterbia fabric has relatively high density, is flexible, and has a minimal defect (flaws) microstructure, a concentrated radiated flux profile and, in the described mantle configuration, withstands impact loads of two thousand g's.

Figure 3:
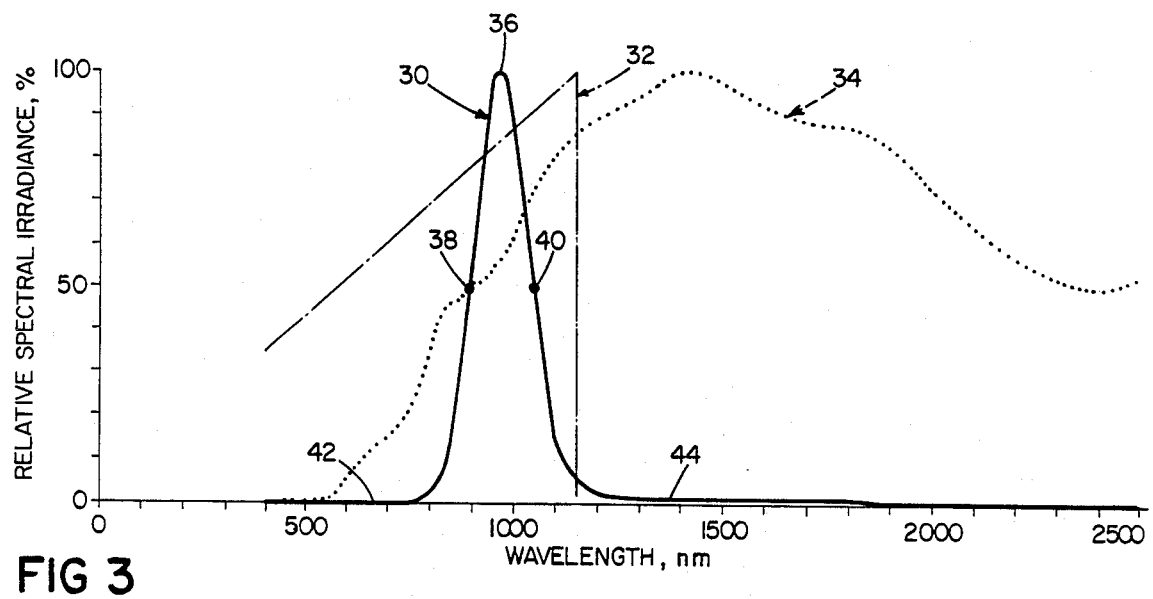
FIG. 3 is a graph indicating spectral characteristics of an ytterbia mantle type radiation source in accordance with the invention, and of a predominately thoria mantle type radiation source of similar configuration.

The graph of FIG. 3 shows a relative spectral irradiance profile 30 of mantle 10, over a 400–2500 nanometer spectral range when that mantle is exposed to an air-isobutane flame (7 sccm isobutane, 113.6 sccm air as measured with Tylan controllers - an oxidant fuel ratio of 16.2). Profile 30 was measured over an interval of 3.2 hours with a Beckman DK-2A prism spectroradiometer operated in single-beam mode with an adjustable slit width. Theoretical photovoltaic response of silicon is indicated by curve 32 in FIG. 3; and the relative spectral irradiance profile of a predominantly thoria mantle, of similar physical shape to mantle 10 that was thermally energized with an an air-isobutane flame (7 sccm isobutane, 191.7 sccm air—an oxidant-fuel ratio of 27.4) and measured in the same manner and over the same wavelength range as profile 30, is indicated by curve 34.

The radiated flux profile 30 of ytterbia mantle 10 has a radiation peak 36 at about 985 nanometers (the spectroradiometer being set to have a slit width of about 0.6 mm at that wavelength) with half intensity points 38, 40 at about 890 nanometers and 1050 nanometers respectively so that peak 36 has a full width at half maximum of about 160 nanometers. The lower skirt 42 of profile 30 of mantle 10 has measured radiated flux levels of less than one-half percent of the peak from 400 nanometers to 725 nanometers, and the upper skirt 44 of profile 30 has radiated flux levels of one percent or less at spectral wavelengths from 1300 nanometers to 2500 nanometers.

Figure 4:
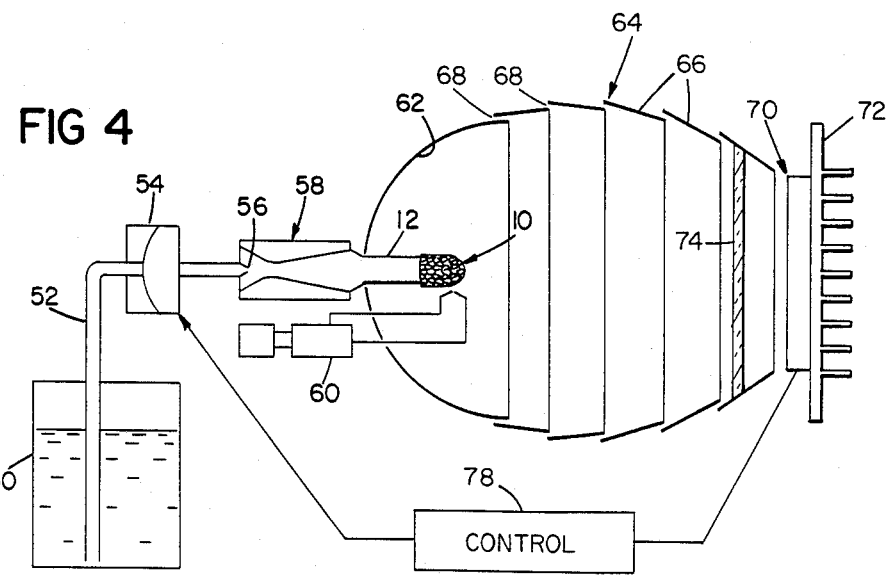
FIG. 4 is a diagram of a thermophotovoltaic device in accordance with aspects of the invention.

In contrast, the Welsbach type thoria mantle of similar physical size and construction has a broad band spectral profile as indicated by curve 34, that profile indicating a radiated flux at 650 nanometers (in the visible region) that is about ten percent of the peak radiated flux; radiated fluxes of about 35% of peak at 800 nanometers, 51% of peak at 900 nanometers, 62% of peak at 1000 nanometers, 81% of peak at 1100 nanometers in the near infrared region; a peak radiated flux at about 1400 nanometers in the far infrared region (the spectroradiometer being set to have a slit width of about 0.8 mm at that wavelength); and radiated flux intensities of about 87% at 1800 nanometers, 64% at 2100 nanometers and 50% at 2400 nanometers. It will be seen that the ytterbia mantle 10 has a narrow well-defined radiation peak 36 in contrast with the broad and diffuse radiation profile 34 of the Welsbach type mantle, as well as almost total suppression of skirts 42, 44 on either side of peak 36. The amplitude of peak 36, in absolute terms, is substantially greater than (about twice) the peak value of the broad band radiator (curve 34) (the area under curve 30 being about one-third the area under curve 34 over the 500–2500 nanometer range). The ytterbia mantle 10 thus provides a high output at about one micron, the wavelength of interest The thermophotovoltaic system shown in FIG. 4 incorporates ytterbia mantle 10. Support tube 12 is connected via a fuel delivery system to fuel reservoir 50 that contains isobutane fuel with outlet tube 52 extending to pressure regulator 54. The high velocity et at flow-through outlet orifice 56 (0.05 millimeter diameter) is directed through venturi 58 (a throat diameter of about one millimeter) to aspirate and mix air with the isobutane fuel for flow through support tube 12 to mantle 10. Piezoelectric ignitor 60 or other suitable ignition means is utilized to generate a spark after the air/fuel mixture delivery system is turned on to ignite the air isobutane fuel mixture at the mantle and provide a maximum flame temperature of about 1900° C.

Figure 5:
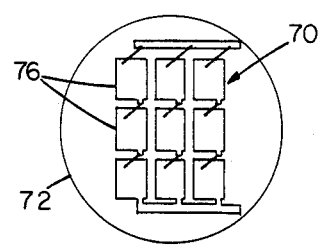
FIG. 5 is a diagrammatic front view of the photocell array employed in the thermophotovoltaic device shown in FIG. 4.

Mantle 10 is disposed in a polished and passivated aluminum reflector 62 which collects and collimates the radiation emitted by mantle 10. A tubular reflector array 64 directs the radiation from mantle 10 on silicon photovoltaic cell array 70 that is mounted on heat sink structure 72. Reflector array 64 is composed of a series of spaced, overlapping wall sections 66 with ventilation ports 68. Radiation transmitting thermal isolation window 74 of glass or other suitable material is supported on one of the sections 66 and disposed between mantle 10 and photocell array 70 for isolating the hot combustion gas in the mantle compartment from the photovoltaic cell array 70. The surfaces of window 74 preferably carry an anti-reflecting coating to lower reflection losses. Preferably, the front surfaces of the photodiodes 76 (FIG. 5) also carry an anti-reflection coating for the same reason that window 74 is coated. To maximize photon conversion, silicon photodiodes 76 preferably are about one millimeter in thickness. Provision of a reflecting layer (for example of silver, aluminum or copper) on the back contacts of the photodiodes 76 further enhances probability of photon conversion. Control system 78 may be connected between regulator 54 and diode array 70 for monitoring the output voltage and modulating the fuel flow by control of regulator 54 to control the electrical output of the photodiode array 70.

The optical temperature of ytterbia mantles 10, measured with a Leeds & Northrup optical pyrometer (Catalog #8632-C) is in the range of 1160°–1190° C. As the emissivity of the highly reflective mantle material (at the 660 nm optical pyrometer measuring wavelength) is less than 0.1, the actual temperature of mantle 10 is about 1700° C.

The electron production threshold of the silicon photovoltaic cells 76 is 1150 nanometers, as indicated by curve 32 in FIG. 3. The ytterbia mantle 10, when heated as described above to about 1700° C., has its peak 36 in close proximity to (about 165 nanometers from) silicon electron production threshold 32 such that the electrical energy conversion efficiency of the system is high —80% of the total radiated flux output of mantle 10 over the 400–2500 nanometer wavelength range being convertible into electrical energy on the basis of the theoretical silicon cell response indicated in FIG. 3.

Figure 6:
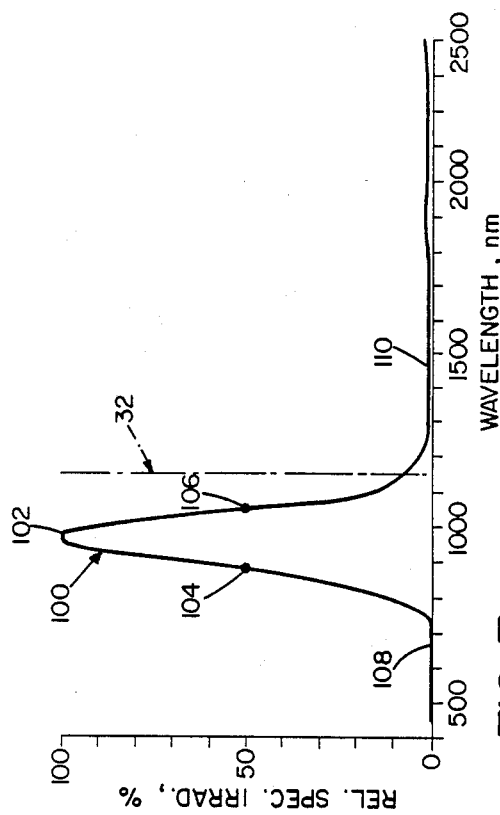
FIG. 6 is a graph indicating spectral characteristics of another ytterbia radiation source in accordance with aspects of the invention and spectral chacteristics of a commercially available predominately thoria mantle.

The graph of FIG. 6 shows the relative spectral irradiance profile 80, over the 400–2500 nanometer spectral range, of a second ytterbia mantle in accordance with the invention. That mantle is formed of a similar tube of knit rayon that was imbibed in a 1.2 molar ytterbium nitrate solution and processed by uniformly torching the dried nitrate impregnated rayon mantle with a blue propane flame to pyrolyze the rayon and shrink the mantle skirt onto its support tube. That ytterbia mantle-support tube assembly was energized with an air-isobutane flame (air/fuel ratio of 27:1) and its radiated flux was measured over the 400–2500 nanometer spectral range with the same equipment as described in connection with the mantle shown in FIGS. 1 and 2. This ytterbia mantle had a radiation peak 82 at about 970 nanometers (the spectroradiometer being set to have a slit width of about 0.6 mm at that wavelength) with half peak intensity points 84 and 86 at about 875 and 1060 nanometers respectively so that peak 82 has a width at half maximum intensity of about 185 nanometers. Measured radiated flux levels of lower skirt 88 were less than one-half percent from 450 to 625 nanometers; and measured radiated flux levels of upper skirt 90 were two percent or less at wavelengths from 1300 to 2500 nanometers. Peak 82 is offset about 180 nanometers below silicon threshold 32. The silicon conversion efficiency of this ytterbia-isobutane mantle system was 74%.

Curve 92 is the relative spectral irradiance profile of a commercial Coleman (Welsbach type) mantle energized in an air/propane flame. It will be seen that curve 92 has a broad spectral profile similar to curve 34, curve 92 having a radiated flux level at 650 nanometers (the upper end of the visible range) of about 46% of its peak radiated flux; radiated flux levels in the near infrared region of about 62% of peak at 800 nanometers, 71% of peak at 900 nanometers, and 85% of peak at 1000 nanometers; a peak radiated flux at about 1400 nanometers (the spectroradiometer being set to have a slit width of about 0.3 mm at that wavelength); and radiated flux outputs of about 80% of peak at 1800 nanometers, 52% of peak at 2100 nanometers and 42% of peak at 2400 nanometers. The silicon conversion efficiency of this Welsbach mantle-propane system is 23%.

Another mantle in accordance with the invention is a self-supporting ytterbia fiber fabric structure that defines a hollow chamber of about twelve millimeters in diameter with its tip about 2.5 centimeters above the upper end surface of a brass fuel supply support tube to which it is secured, the support tube having an outer diameter of about twelve millimeters and an inner diameter of about seven millimeters, the lower portion of the mantle fabric sleeve being firmly shrink-secured to the outer surface of the support tube. The mantle fabric is composed of ytterbia multi-filament strands in a knit array that has an open area of about 30%, the cross-sectional dimensions of the individual ytterbia fibers of the strands of this mantle being about fifteen micrometers, and the strands having cross-sectional dimensions of about 0.2 millimeter with openings having dimensions of about 0.3 millimeter.

This mantle was manufactured from continuous low twist, low tenacity (highly reticulated), viscose rayon yarn (300 denier/50 filament) that was knitted into a continuous tubular sleeve using a Lamb circular string knitter (Model ST3A/ZA) with a 3.8 centimeter diameter arbor and sixty needle capacity using sixty equally spaced needles in the arbor with tension on both the yarn and the knitted sleeve to attain eight stitches per linear centimeter of tensioned sleeve. An imbibing solution 1.57 molar in ytterbium nitrate was formed and a length of the knitted rayon sleeve was immersed for about one hour in the imbibing solution at room temperature, with gentle agitation to promote penetration of the imbibing solution into the rayon fibers. After imbibition and centrifugation, the imbibed sleeve was formed into mantle socks, disposed on brass support tubes, and processed by uniformly torching the dried nitrate impregnated rayon mantle with a blue propane flame to pyrolyze the rayon and shrink the mantle skirt onto its brass support tube.

Figure 7:
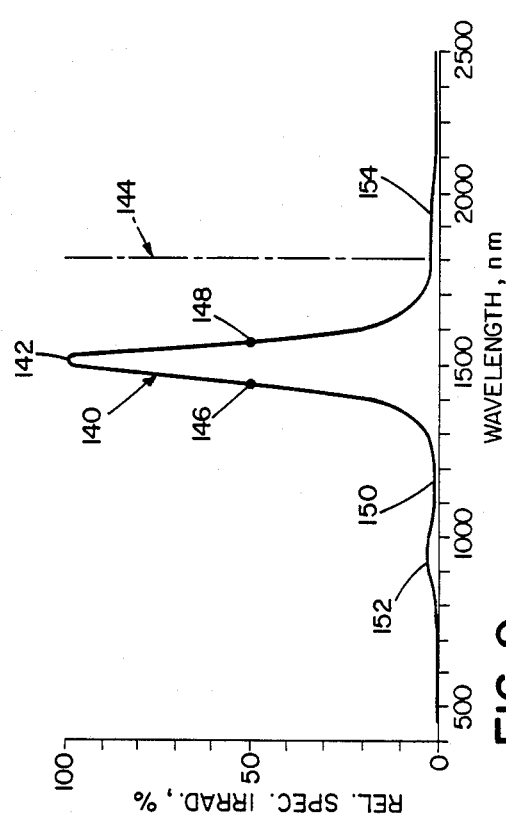
FIG. 7 is a graph indicating spectral characteristics of another ytterbia radiation source in accordance with the invention energized with a hydrogen flame.
Figure 8:
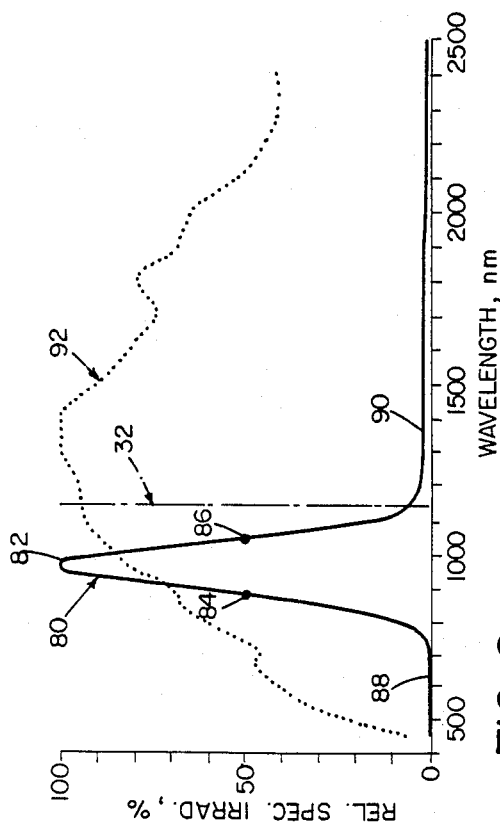
FIG. 8 is a graph indicating spectral characteristics of an ytterbia-ceria radiation source.

That ytterbia mantle-support tube assembly was then exposed to an air-isobutane flame (91 sccm isobutane, 2460 sccm air as measured with Tylan controller—an oxidant fuel ratio of about 27:1), and its resulting spectral irradiance profile was measured with a Beckman DK-2A prism spectroradiometer operated in single-beam mode with the spectroradiometer set to have a slit width of about 0.035 mm over the 400–2400 nanometer wavelength range. The resulting radiated flux profile of that ytterbia mantle had a radiation peak at about 1010 nanometers (offset about 140 nanometers below the silicon threshold) with half intensity points at about 905 nanometers and 1080 nanometers respectively so that its peak had a full width at half maximum of about 175 nanometers. The lower skirt of the profile of the mantle had measured radiated flux levels of less than one-half percent of the peak, and the upper skirt of the profile had radiated flux levels of seven percent or less at spectral wavelengths from 1300 nanometers to 2400 nanometers. The silicon conversion efficiency of this ytterbia-isobutane mantle system was about 72%. The relative spectral irradiance profile 100 of still another ytterbia mantle is shown in FIG. 7. The ytterbia fiber configuration and composition (a 1.74 molar ytterbia imbibing solution was used) were similar to mantle 10. After the ytterbia mantle was carefully burned off in propane, profile 100 was obtained by exposing the mantle to an air-hydrogen flame (maximum flame temperature about 2045° C.) with the burner stem orifice reduced to an inner diameter of 0.25 millimeter to avoid flashback at the fuel flow rate employed (a 1.52 millimeter burner orifice was used with isobutane fuels). The ytterbia mantle was exposed to a air-hydrogen flame (70 sccm air flow rate, 112 sccm hydrogen flow rate) and measured with the Beckman spectroradiometer operated in single beam mode with a 0.8 millimeter slit width at the 965 nanometer peak. The resulting normalized spectral irradiance profile 100 as shown in FIG. 7 had a peak 102 at about 965 nanometers (offset about 185 nanometers from silicon threshold 32), half intensity points 104, 106 at about 890 and 1050 nanometers so that peak 102 had a full width at half maximum of about 160 nanometers; a lower skirt 108 that had less than one-half percent measured radiated flux levels from 450 to 675 nanometers and an upper skirt 110 that had radiated flux levels of about one percent from 1500 to 2300 nanometers (with the exception of a two percent radiated flux level at 1900 nanometers). The silicon conversion efficiency of this ytterbia-hydrogen mantle system was 76%. The relative spectral irradiance profile of still another mantle system is shown in FIG. 8, a knitted rayon tube of the same configuration as that used for mantle 10 being imbibed with a solution of 1.69 molar ytterbia nitrate and 0.035 molar cerium nitrate and then pyrolyzed by burning off in propane. Its radiated flux was then measured with the Beckman spectroradiometer with the same techniques as employed with the preceding examples employing a slit width of 0.55 millimeter at the 960 nanometer peak. Profile 120 of that ytterbia-ceria mantle had a radiation peak 122 at about 960 nanometers (the spectroradiometer being set to have a slit width of about 0.6 mm at that wavelength), half intensity points 124, 126 at about 900 and 1050 nanometers respectively so that peak 122 has a full width at half maximum of about 150 nanometers; a lower skirt 128 of less than one-half percent measured radiated flux levels from 450 to 525 nanometers; about one percent of peak radiated flux at 650 nanometers; and an upper skirt 130 with radiated flux levels of six to eight percent from 1300 nanometers to 1900 nanometers and radiated flux levels of three percent or less from 2200 nanometers to 2500 nanometers. Mantle profile 120 has a silicon conversion efficiency of 58%.

Figure 9:
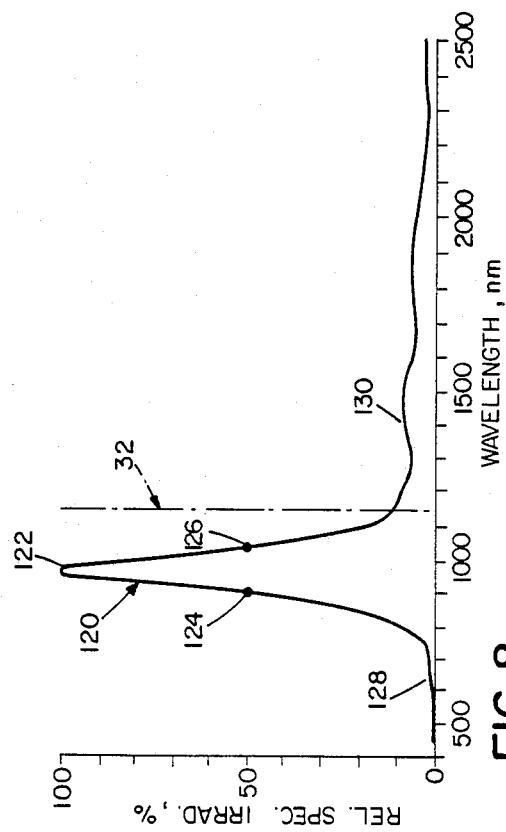
FIG. 9 is a graph indicating spectral characteristics of an erbia radiation source in accordance with aspects of the invention.

Shown in FIG. 9 is the normalized relative spectral irradiance profile 140, over a 450–2500 nanometer spectral range, of an erbia mantle formed by imbibing a rayon sleeve similar to the sleeve used to form mantle 10 with a 0.92 molar solution of erbium nitrate and then carefully torching the imbibed sleeve in propane to pyrolyze the rayon and shrink the mantle skirt on its support tube. Profile 140 was obtained by exposing that erbia mantle to a air-isobutane flame (air/fuel ratio of 26.2). The resulting erbia mantle profile 140 as shown in FIG. 9 had a radiation peak 142 at about 1500 nanometers (the spectroradiometer being set to have a slit width of about 0.4 mm at that wavelength)—peak 142 being offset about 300 nanometers from germanium electron production threshold 144; half intensity points 146 and 148 at about 1430 and 1570 nanometers respectively so that peak 142 had a full width at half maximum of about 140 nanometers; a lower skirt 150 that had less than one percent of peak radiated flux for the range of 450-750 nanometers, and a component 152 at about three percent of peak intensity from 900 nanometers to 1000 nanometers; and an upper skirt 154 that had radiated flux levels of two percent or less from 1800 nanometers to 2500 nanometers. In a more precise measurement of profile 140 over the 1200-2000 nanometer wavelength range (the spectroradiometer being set to have a slit width of about 0.04 mm)—peak 142 was located at about 1515 nanometers (offset about 285. nanometers from germanium electron production threshold 144; and half intensity points 146 and 148 were at about 1480 and 1545 nanometers respectively so that peak 142 had a full width at half maximum of about 65 nanometers. The optical temperature of erbia mantles, measured with a Leeds & Northrup optical pyrometer (Model #8632-C) is in the range of 1400°–1450° C. As the emissivity of the erbia mantle material (at the 660 nm optical pyrometer measuring wavelength) is about 0.5, the actual temperature of the erbia mantle is about 1600° C. This narrow band erbia radiation source couples well to a germanium photocell and such a thermophotovoltaic system has a germanium photocell conversion efficiency of about 77%. The erbia mantle provides a high output at about 1.5 microns, the wavelength of interest, in contrast to the lower absolute values of output peaks of comparable broad band radiators of the type indicated by curve 34, for example.

While particular embodiments of the invention have been shown and described, various modifications will be apparent to those skilled in the art, and therefore it is not intended that the invention be limited to the disclosed embodiments or to details thereof, and departures may be made therefrom within the spirit and scope of the invention.

What is claimed is:

1. A narrow band thermal emitter device comprising, a rare earth metal oxide radiator, and means for thermally exciting said radiator to cause it to emit radiation, said radiator, when heated to 1700° C., emitting radiation in a spectral irradiance profile that has a narrow radiated flux peak, said flux peak having a full width at half maximum of less than four hundred nanometers and said relative spectral irradiance profile of said radiator also having suppressed skirt characteristics such that, at wavelengths five hundred nanometers above and below said flux peak, the radiated flux levels of said skirts are less than ten percent of the radiated flux at said peak.

2. The emitter device of claim 1 wherein said radiator is composed of metal oxide filaments, each said filament having a cross-sectional dimension in the range of five--thirty micrometers.

3. The emitter device of claim 2 wherein said radiator is composed of multi-filament metal oxide strands that have a cross-sectional dimension in the range of 0.05-0.3 millimeter.

4. The emitter device of claim 1 wherein said radiator is composed of filaments of an oxide of ytterbium, each said filament having a cross-sectional dimension in the order of ten micrometers.

5. The emitter device of claim 1 wherein said radiator is composed of filaments of an oxide of erbium, each said filament having a cross-sectional dimension in the order of ten micrometers;

6. The emitter device of claim 1 wherein said radiator, when heated to 1700° C., emits radiation in a concentrated portion of the 400-2500 nanometer wavelength range such that at least 50% of the radiated flux is within a band less than 400 nanometers in width, said flux peak has a full width at half maximum of less than two hundred nanometers and said suppressed skirt characteristics are such that, at wavelengths in the range of three-five hundred nanometers above and below said flux peak, the radiated flux levels of the skirts are less than five percent of the radiated flux at said peak.

7. The emitter device of claim 1 wherein said means for thermally exciting said radiator includes a supply of a liquid or gaseous fuel such as hydrogen, natural gas, propane, butane, isobutane, or gasoline.

8. The emitter device of claim 1 wherein said radiator is composed of interlocked metal oxide fibers, each said fiber having a cross-sectional dimension in the range of five-thirty micrometers.

9. The emitter device of claim 1 wherein said fibers of said radiator are composed substantially entirely of the oxide of a host metal selected from the group of ytterbium and erbium.

10. A method of operating a radiator of rare earth metal oxide material comprising the step of thermally exciting said radiator to heat said radiator to a temperature in the range of 1500°–2000° C. to cause said radiator to emit radiation in a spectral irradiance profile that has a narrow radiated flux peak, said flux peak having a full width at half maximum of less than four hundred nanometers and said spectral irradiance profile of said radiator also having suppressed skirt characteristics such that, at wavelengths five hundred nanometers above and below the flux peak, the radiated flux levels of the skirts are less than ten percent of the radiated flux at said peak.

11. The method of claim 10 wherein said metal oxide radiator material is in the form of structure that has a cross-sectional dimension in the range of five–thirty micrometers.

12. The method of claim 11 wherein said radiator is composed of metal oxide strands.

13. The method of claim 12 and further including the steps of supporting said radiator adjacent the outlet port of a fuel supply conduit, flowing fuel through said conduit to said radiator, and igniting said flowing fuel to cause said radiator to emit radiation in said spectral irradiance profile.

* * * * *